US006225239B1

United States Patent
Ohno et al.

(10) Patent No.: US 6,225,239 B1
(45) Date of Patent: May 1, 2001

(54) ORGANIC FILMS AND A PROCESS FOR PRODUCING FINE PATTERN USING THE SAME

(75) Inventors: Hirotaka Ohno; Kazushi Fujioka; Mikihiro Yamanaka; Satoko Mitarai, all of Osaka; Hiroshi Tokumoto, Tsukuba, all of (JP)

(73) Assignees: Sharp Kabushiki Kaisha, Osaka; Agency Industrial Science and Technology, Tokyo, both of (JP)

( * ) Notice: Subject to any disclaimer, the term of this patent is extended or adjusted under 35 U.S.C. 154(b) by 0 days.

(21) Appl. No.: 09/163,975

(22) Filed: Sep. 30, 1998

(30) Foreign Application Priority Data

Sep. 30, 1997 (JP) .................................... 9-282781
Sep. 30, 1997 (JP) .................................... 9-282782

(51) Int. Cl.$^7$ .................................................. H01L 21/469
(52) U.S. Cl. ........................................ 438/780; 438/780
(58) Field of Search ................................... 438/604, 623, 438/758, 780, 939, 622, 779, 781

(56) References Cited

U.S. PATENT DOCUMENTS

| 5,079,179 | * | 1/1992 | Josefowicz | 437/41 |
| 5,152,805 | * | 10/1992 | Geddes et al. | 29/25.02 |
| 5,284,779 | * | 2/1994 | Miyamaga | 437/1 |
| 5,684,165 | * | 11/1997 | Cabrera et al. | 549/50 |
| 5,970,381 | * | 10/1999 | Ohno et al. | 438/758 |
| 5,998,304 | * | 12/1999 | Houng et al. | 438/758 |

* cited by examiner

Primary Examiner—David Nelms
Assistant Examiner—David Nhu
(74) Attorney, Agent, or Firm—Oblon, Spivak, McClelland, Maier & Neustadt, P.C.

(57) ABSTRACT

This invention provides a process for accumulating different organic molecular films on oxidized III–V-group compound semiconductor substrates in order to produce a stable, high-quality organic monomolecular film that is three-dimensionally regularly arranged, as well as a process for producing a fine pattern of such organic films. This organic film is formed by immersing a III–V group compound semiconductor substrates in a vessel containing a solution containing phosphonic acid dissolved into a solvent in order to form a self-assembled film, and placing the substrate into a different solution to adsorb metal ions to the surface of the film, or immersing the substrate in a bromide or an acid or alkali solution to denature functional groups, then immersing it in a solution containing organic molecules that are selectively chemically adsorbed to the modified functional groups. These steps are repeated to form a stable, high-quality multilayer film that is three-dimensionally regularly arranged, while controlling film thickness with an accuracy on the scale of thickness of a molecular layer.

In addition, the present invention realizes the formation of a fine composite three-dimensional organic self-assembled film of the order of nanometer, characterized in that the process comprises using a cleavage method or a very-high-vacuum vessel to form on a substrate with different types of III–V-group semiconductor materials mixed thereon by means of the heteroepitaxial process such as the MBE or MOCVD process, a self-assembled film of the molecules having thiol groups in a non-oxidized area and then forming on an oxidized surface a self-assembled film of molecules having phosphoric acid group, trichlorosilyl groups or alkoxylyl groups.

17 Claims, 12 Drawing Sheets

ORGANIC FILMS AND A PROCESS FOR PRODUCING FINE PATTERN USING THE SAME

FIELD OF THE INVENTION

The present invention relates to a process for manufacturing a monomolecular film and an organic built-up film that are two-dimensionally regularly arranged on both an oxidized and a bare III–V-group compound semiconductor substrate, and to a method for producing a fine pattern using the organic films.

DESCRIPTION OF THE PRIOR ART

Langmuir Blodgett films (hereafter referred to as "LB films") and self-assembled monolayers (hereafter referred to as "SA films") are the well known types of organic monomolecular films or organic built-up films (Abraham Ulman, "An Introduction to Ultrathin Organic Films From Langmuir-Blodgett to Self-Assembly," Academic Press 1991). Of the two, the LB film is formed by developing amphiphilic molecules having both hydrophilic and hydrophobic atomic groups, on the water surface as a monomolecular film (an "L film"), transferring the film to a solid substrate, and accumulating a number of films thereon. The LB film is named after Langmuir and Blodgett, who developed the process. Since this process uses the difference in hydrophobic and hydrophilic properties between the film and the substrate to transfer the film spread on the water surface to the substrate, the crystallinity of the film is determined when it is spread and compressed. Thus, the crystallinity of the film does not depend on the type of substrate used, and the film can be formed on any substrate. Due to the nature of the LB film, however, the interaction between the substrate and the monomolecular film is very weak and the acid and alkali resistance and durability of the film are insufficient for the construction of complex devices. In addition, to produce the LB film, an exclusive apparatus is required for developing amphiphilic molecules on the surface of a solution, compressing the molecules on the surface, and transferring them to the substrate.

The SA film is formed when functional groups at the terminals of molecules selectively chemically adsorb atoms constituting a substrate. Thus, due to the nature of the adsorption mechanism, this film is formed in such a way that only a monomolecular film is self-assembled. Since the film can be formed by simply immersing the substrate in a solvent containing the molecules, this process does not require a large complicated apparatus, and it is also essentially possible to form a built-up film by selecting the type of the terminal group outside the formed SA film. These molecular films form a two-dimensional molecular set due to the Van der Waals force, and this process can be used to create an array in which molecules are regularly packed, that is, a two-dimensional crystal. This feature can be used to construct various electronic and optical devices.

The SA film does not have the disadvantages of the LB film, but due to the use of chemical adsorption between the functional groups and the substrate, limited combinations of functional groups and substrates can be formed. The monomolecular films are conventionally formed on a substrate of silicon oxide, aluminum oxide, silver oxide, mica, gold, copper, or GaAs. In the case of a GaAs substrate, an SA film can be obtained only by subjecting the substrate to hydrochloric processing in such a way that it is As-terminated, applying a molten liquid of organic molecules containing SH groups to the surface of the substrate in a nitrogen atmosphere, and allowing the substrate to stand at 100° C. for five hours. Thus, although the SA film has a larger number of advantages than the LB film, there are very few examples of III–V-group compound semiconductor SA films or their multilayer films.

In addition, techniques for forming a multilayer film that inherits the large number of advantages of the SA film are very important because they can provide characteristics that cannot be obtained through creation of more complex monomolecular films, and because the multilayer is expected to amplify the film's functions.

That is, the SA film has several preferable characteristics. For example, SA systems are thermodynamically stable because of its film formation process. Thus, systems can be obtained that allow a highly defectless and uniform SA film to be self-assembled. Moreover, a damaged SA film can be self-repaired when returned to an appropriate environment. Another advantage of the SA film is that due to easy preparation the film can be formed inexpensively.

Although the SA molecules can be bound to the surface of the above substrate, binding to a host substance depends on the chemical composition of the SA molecule. The SA molecule can be divided into two groups: a head and an end group. An example of an SA molecule is $CH_3(CH_2)_{17}SH$, and in this case, S—H is a head group and $CH_3(CH_2)_{17}$ is an end group with respect to, for example, a GaAs substrate.

The head group has a strong affinity for particular substances, so it is immediately bound to a host substance during chemical adsorption. The head group is chemically bound to the substrate, but the adsorbed molecules probably still have a certain level of mobility. The end group is divided into two subgroups: an alkyl and a tail group. The alkyl group or an alkyl derivative group constitutes a main part of the SA molecule. The length of this molecular main part can be adjusted easily by varying the number of units in an alkyl chain ($C_nH_{2n+1}$). The tail group is used to terminate the end of the molecule. A methyl group ($CH_3$) is often used for a simple SA molecule. The same SA molecule, however, provides different head and end groups depending on the host substance.

The SA film is expected to have applications to a passivation layer, a resist material for lithography, or a functional element in a future electronic device. An example technique for applying SA film to an electronic device is the use of SA film as a photo resist, as described in Jpn. J. Appl. Phys. Vol. 32 (1993) pp. 5829 to 5839. The SA film process enables a defect free film as thin as a monomolecular film to be produced, in order to reduce the wavelength while improving the focal depth, making this film effective as a photo resist because the patterns used for electronic devices are expected to become finer in the future.

Despite the several advantages of the SA film and its expected applications to various fields including electronic devices, application techniques have not yet been sufficiently developed. For example, the application of the SA film to photo resist relies on the conventional exposure process, so finer patterns mostly contribute to an exposure apparatus; and reduction of the pattern's line width is limited. On the other hand, as the integration of electronic devices is improved, the industry desires to establish techniques for creating finer patterns, including existing lithography techniques. In parallel with the development of devices having fine patterns, electronic physical properties of fine lines on the nanometer scale, for example, 1 to 20 nm must be clarified before such devices can be designed. Such thin lines involve notable quantum-mechanic phenomena and their physical properties cannot be directly assumed based on the physical properties of thicker lines.

Thus, a technique for producing lines on the nanometer scale is required, but existing techniques cannot produce such lines.

SUMMARY OF THE INVENTION

It is an object of this invention to enable an excellent and firm organic monomolecular film with few defects to be produced by allowing film-producing molecules to be selectively chemically adsorbed onto an oxidized III–V-group compound semiconductor substrate, in contrast to the conventional techniques.

It is another object of this invention to provide a process for using chemical adsorption to further accumulate different types of organic molecules on the above monomolecular film, in order to control the film thickness in terms of the molecular length, thereby enabling the fabrication of an excellent organic film that is flat and dense at an atomic level and that has no pin holes.

It is yet another object of this invention to provide a method for producing a fine pattern wherein two or more different types of SA organic monomolecules or their laminated films can be used to produce a fine pattern within the same surface.

To achieve these objects, this invention provides a process for manufacturing an organic film, which basically comprises immersing an oxidized III–V-group compound semiconductor substrate in a solution containing amphiphilic organic molecules having a $PO_3H_2$ group derivative at their terminal group, in order to allow the organic molecules to be adsorbed on the surface of the substrate.

An organic monomolecular film can be accumulated on a first organic monomolecular film by immersing the first organic monomolecular film in a solution containing metal ions to allow the ions to be adsorbed on the surface of the monomolecular film, or by chemically processing to denature surface functional groups to OH groups and then immersing the film in a solution having functional groups that are selectively chemically adsorbed onto the metal ions or the OH groups.

In this process, the step for further and accumulatively forming an organic monomolecular film on the first organic monomolecular film can be repeated to form a built-up film that effects a strong binding force between the organic films and in which the in-plane directions of the films are regularly arranged, while controlling the film thickness in terms of the organic molecular length.

The process according to this invention can use a III–V-group compound semiconductor substrate as well as selective chemical adsorption on molecules having a $PO_3H_2$ group at their terminal to form an excellent monomolecular film and an excellent built-up multilayer film that are both firmly adhered to the substrate and regularly arranged in both lateral and vertical directions. Thus, this process can make most of the functions of the films and can produce films having acid and alkali resistance, durability, reliability, and an excellent insulating characteristic.

In addition, the present process for producing a fine pattern using organic films basically comprises a first step for forming adjacent faces exhibiting different chemical adsorption capabilities for SA molecules or adjacent faces of different crystals, on a processed body in a non-oxidized atmosphere; a second step for placing the adjacent faces in an atmosphere in which the SA molecules flow in a molecular state in order to allow the SA molecules to be chemically adsorbed on the processed body; a third step for washing the processed body to remove excessive SA molecules deposited thereon in order to obtain a pattern of SA molecules; a fourth step for washing the processed body to remove excessive SA molecules deposited thereon in order to allow the molecules to be chemically adsorbed on a portion of the processed body that has not been covered with SA molecules during the third step; and a fifth step for washing the processed body to remove excessive SA molecules deposited thereon in order to obtain a pattern of SA molecules.

This invention enables an arbitrary pattern, for example, lines on the nanometer scale to be produced using SA molecules, and also enables the electric characteristics of these lines to be measured. This invention thus provides an effective process useful for designing an electronic device with a fine pattern.

DESCRIPTION OF THE EMBODIMENTS

Figure 1:
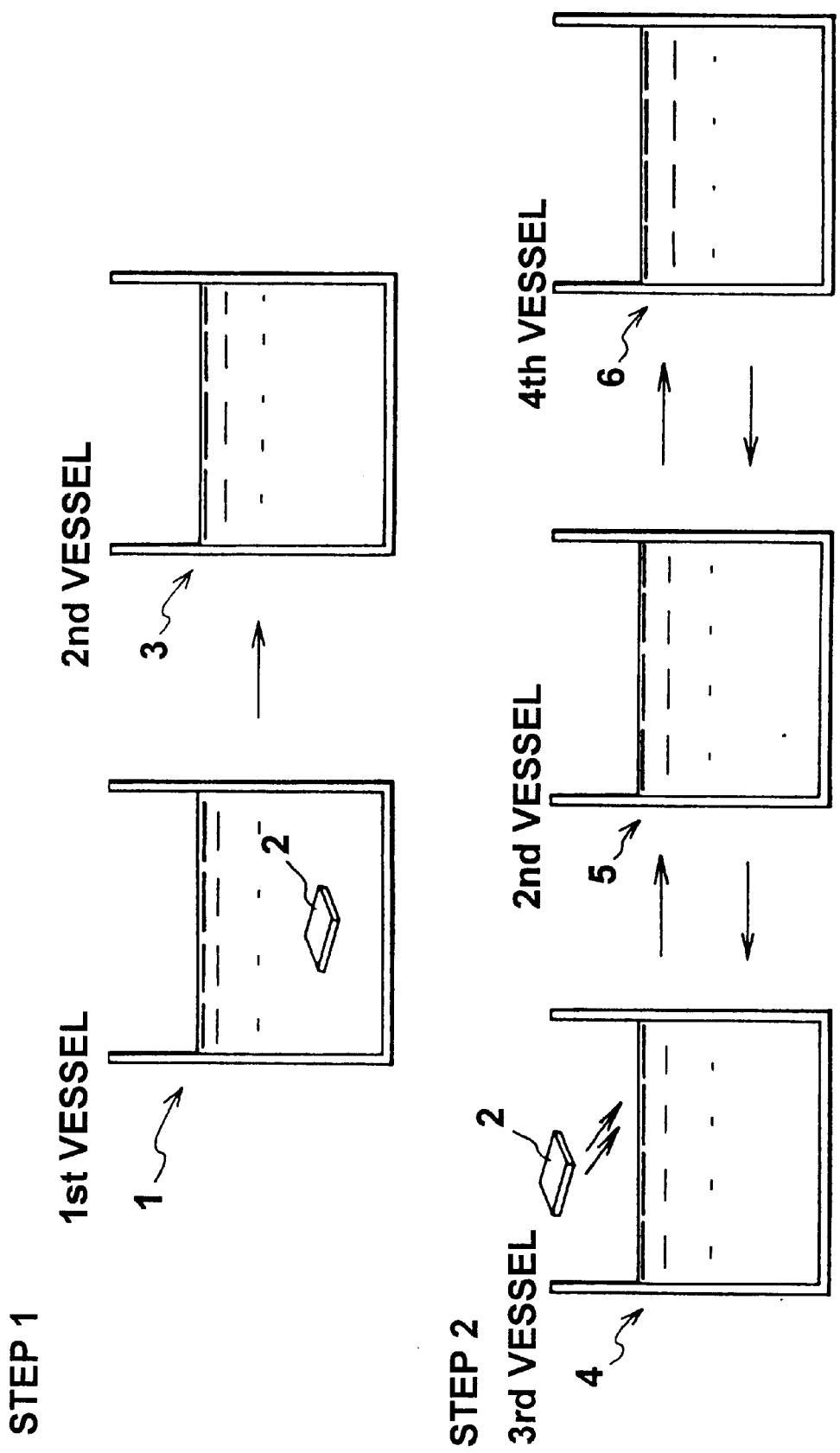
FIG. 1 is a schematic explanatory drawing of a process for manufacturing organic laminated films, which is described as Embodiment 1 of this invention.

In a process for manufacturing organic films according to this invention, an organic monomolecular film (a first organic monomolecular film) is formed on an oxidized III–V-group compound semiconductor substrate by exposing an oxidized surface of a III–V-group compound semiconductor substrate to an organic solvent containing diluted amphiphilic organic molecules having a $PO_3H_2$ group derivative at their terminal group, in order to allow the organic molecules to be chemically adsorbed on the substrate to form a monomolecular film of the molecules, as described above.

Specifically, the amphiphilic organic molecules forming the first organic monomolecular film may comprise organic molecules having a COOH or $PO_3H_2$ group at their other end. Accordingly, an organic monomolecular film is accumulated on the first organic monomolecular film formed in the above manner by immersing the substrate in a solution containing metal ions and then immersing the substrate in a solution containing amphiphilic molecules having an SH group at one end and a COOH group at the other end, or in a solution containing amphiphilic molecules having a $PO_3H_2$ group at both end, in order to accumulate an organic monomolecular film. To accumulate more layers, this process may be repeated.

In addition, a first organic monomolecular film can be formed by immersing the oxidized III–V-group compound semiconductor substrate in a solution containing amphiphilic organic molecules having a $PO_3H_2$ group at one end and a $COOCH_3$ or $CH_2=CH$ group at the other end, in order to allow the organic molecules to be chemically adsorbed onto the surface of the substrate. In this case, another organic monomolecular film is accumulated on the first organic monomolecular film by using a solution of $LiAlH_4$ dissolved into an organic solvent and dilute hydrochloric acid, or by using a solution of $B_2H_6$ dissolved into an organic solvent and a mixed solution of sodium hydroxide and hydrogen peroxide to process the substrate so as to denature surface functional groups to OH groups and then immersing the substrate in a solution containing amphiphilic molecules having a $COOCH_3$ or $CH_2=CH$ group at one end and a $SiCl_3$ group at the other end.

If an organic film is formed using 1,16-hexadecylbisphosphonic acid $[H_2O_3P(CH_2)_{16}PO_3H_2]$ (hereafter referred to as "HDBP") as the amphiphilic organic molecule having a $PO_3H_2$ group derivative at its terminal group and when a III–V-group compound semiconductor substrate is cleaned in a solution of HDBP diluted down to 10 mM using pure ethanol and is naturally oxidized prior to immersion, the immersion time may generally be 1 hour to 10 days, preferably 1 hour to 3 days, and more preferably 1 to 12 hours. Although this embodiment has been described in conjunction with the use of HDBP for obtaining a monomolecular film, the above description is applicable to the formation of a film of molecules having another $PO_3H_2$ group.

After the formation of the first molecular film, when an organic multilayer film is accumulated on the SA film produced on the surface of the III–V-group compound semiconductor and if the substrate is then immersed in, for example, a copper acetate $[(CH_3COO)_2Cu]$ solution diluted down to 1 mM using pure ethanol, the immersion time may be generally 1 second to 30 minutes, preferably 10 seconds to 10 minutes, and more preferably 30 seconds to 5 minutes. The substrate is removed from the solution and supersonically washed using pure ethanol. Then, when a second organic molecular film is accumulated and if, for example, an SA film GaAs substrate processed using Cu ions is immersed in a 16-mercaptohexadecanoic acid[$SH(CH_2)_{15}COOH$](hereafter referred to as "MHDA") solution diluted down to 10 mM using pure ethanol, the immersion time may be generally 30 minutes to 10 days, preferably 40 minutes to 1 day, and more preferably 1 to 4 hours. A second and subsequent layers can be accumulated to form a built-up film of a predetermined thickness by alternately immersing the substrate in a copper acetate solution or a MHDA under similar conditions.

Although this embodiment has been described in conjunction with the use of MHDA for accumulating multiple films, the above description is applicable to the formation of other organic molecular built-up films. In addition, although in the above example, the concentration of the solution is limited to 10 mM, the immersion time must be adjusted depending on the concentration in order to obtain the above organic molecular films.

Next, a process for producing a fine pattern using the above organic films according to this invention is explained.

The present process for producing a fine pattern basically comprises a first step for forming adjacent faces exhibiting different chemical adsorption capabilities for SA molecules or adjacent faces of different crystals, on a processed body in a non-oxidized atmosphere; a second step for placing the adjacent faces in an atmosphere in which the SA molecules flow in a molecular state in order to allow the SA molecules to be adsorbed onto the processed body; a third step for washing the processed body to remove excessive SA molecules deposited thereon in order to obtain a pattern of SA molecules; a fourth step for placing the adjacent faces in an atmosphere in which the SA molecules flow which have different from chemical reactivity to the substrate material in a molecular state, in order to allow the molecules to be chemically adsorbed on a portion of the processed body that has not been covered with SA molecules during the second step; and a fifth step for washing the processed body to remove excessive SA molecules deposited thereon in order to obtain a patterned mixed SA molecules.

The different chemical adsorption capabilities for SA molecules indicate that a certain type of SA molecules are chemically adsorbed on one face but not on the other, or that one of two types of SA molecules are chemically adsorbed on only one of the faces while the other type is adsorbed only on the other face. The non-oxidized atmosphere in the first step includes, for example, a solution of ethanol, a vacuum atmosphere, and an inert gas atmosphere.

An example of the formation of adjacent faces in the first step includes the formation on a crystal of a III–V-group compound, of an epitaxial layer of another III–V-group compound. The different III–V-group compounds denote that the compounds have different components, so that for example, GaAs, $Al_xGa_{(1-x)}As$, and GaSb are different compounds. Another example is the cleaving of a laminate of different epitaxial layers in the laminating direction to expose the lamination face (i.e., the face exhibiting different chemical adsorption capabilities for SA molecules). This step is carried out in an non-oxidized atmosphere so as not to grow an oxide film on the adjacent faces.

If an epitaxial layer is formed in a certain crystal during the first step, an epitaxial layer may be simply formed on the surface of the crystal, followed by the cleaving of the laminate. An epitaxial layer having components different from those of the crystal, however, may be grown on a surface of the crystal that is slightly inclined from a certain face on the cut face. That is, the crystal is cut to form a crystal face that is slightly inclined from the original surface or a different crystal face on the cut face. Specifically, when for example, a wafer of a III–V-group compound is formed by mechanical polishing and etching in such a way as to have a face slightly inclined from a (100) crystal face, a crystal face is exposed that is offset from the (100) crystal face by 2°. When a GaAs layer of several 100 nm is formed on this crystal using an epitaxial growth process, a GaAs film is selectively formed on the (100) crystal face to provide a stepped substrate surface having terraces on the (100) crystal face. This is because the epitaxial layer does not grow along the cut face or on the original crystal face due to the different surface energies of the different crystal faces.

Figure 11A:
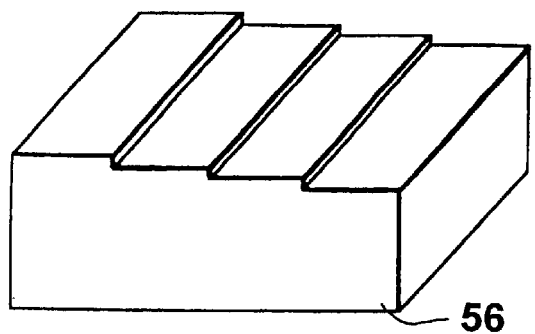
FIGS. 11(a) to 11(d) are a process drawing showing that lines are formed by allowing self-assembled molecules to be adsorbed using a slightly inclined GaAs(001) substrate surface formed by step-flow-growing a III–V-group semiconductor that is different from GaAs.
Figure 11B:
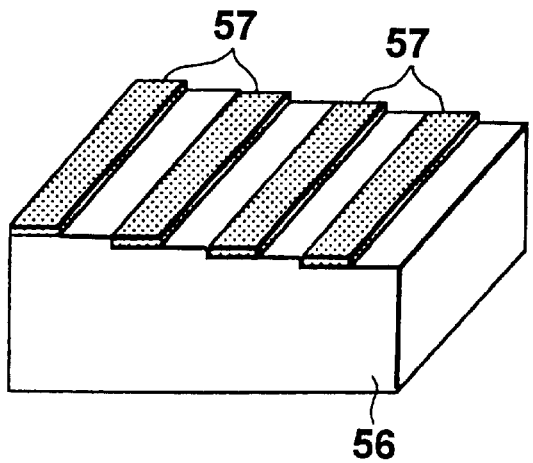

Furthermore, by using the epitaxial method to grow a different III–V-group layer, for example, an $Al_xGa_{(1-x)}As$ layer and by controlling the growth time and speed, a III–V-group layer different from a GaAs layer can be grown on part of the terrace instead of on its overall surface, as shown in FIG. 11(b), which is described below. This is because the film grows on the terrace in a step flow manner instead of isotropically. Thus, a pattern of a group of SA molecules is formed by forming on a processed body, faces having different chemical adsorption capabilities for SA molecules, for example, allowing SA molecules to be chemically adsorbed on one of these faces. The line width of this pattern corresponds to, for example, the thickness of the epitaxial layer, and since the thickness of the epitaxial layer can be controlled down to the order of a one-atom layer using, for example, the molecular-beam epitaxial technique, the line width of the pattern can be controlled down to the order of one-atom layer as well.

The step for allowing SA molecules to be adsorbed on the processed body corresponds to the second step according to this invention. The atmosphere in this step in which SA molecules flow in a molecular state corresponds to, for example, a solution into which a solid consisting of a group of SA molecules is dissolved or a gas in which SA molecules are present (e.g., vapors from a solution of a group of SA molecules). Furthermore, the method for washing the processed body during the third step includes use of an ethanol solution to wash the body to remove excessive SA molecules. The step for allowing SA molecules to be chemically adsorbed on a portion of the processed body that is not covered with SA molecules corresponds to the fourth step according to this invention, and uses organic molecules having at their terminal a $PO_3H_2$, $SiCl_3$, or $Si(O(CH_2)_nCH_3)_3$ group that can be selectively adsorbed on a position of the processed body on which SA molecules have not been adsorbed during the second step due to surface oxidation. The chemical adsorption of SA molecules can be formed by a method similar to that in the second step.

In addition, organic molecules can be laminated prior to the fourth step by chemically processing the surfaces of SA molecules adsorbed in a pattern. If, for example, 18-mercaptooctadecanoic acid [$SH(CH_2)_{17}COOH$] (hereafter referred to as "MODA") is used as SA molecules, the surfaces of the SA molecules are modified with $Cu^{2+}$ ions during the sixth step by immersing in a certain $Cu(COOCH_3)_2$ solution the processed body with SA modules adsorbed thereon that was obtained by the second and third steps. Subsequently, at the seventh step, organic molecules having an SH or $PO_3H_2$ group at their terminal group are chemically adsorbed. This chemical adsorption step can be formed by a method similar to that in the second step. These steps can be repeated to form an organic film having SA molecules laminated only in the area on which SA molecules are adsorbed.

Furthermore, once the fifth step has been finished, only one of the two groups of SA molecules, each formed in a pattern by means of chemical adsorption during the second or fourth step, can be subjected to chemical processing appropriate for the surface of the relevant area to further laminate organic molecules onto this surface. The area on which SA molecules can be formed can be determined by the combination of previously formed SA molecules and a solution for chemical processing. If, for example, HDBP is used as SA molecules formed during the fourth and fifth steps, the substrate can be immersed in a certain oxy zirconium chloride $ZrOCl_2 \cdot 8H_2O$ solution in the ninth step to allow modification using $Zr^{2+}$ ions, of only the surfaces of the SA molecules in that area of the processed body with SA modules adsorbed thereon, as obtained by the fourth and fifth steps. The tenth step can chemically adsorb organic molecules having an SH or $PO_3H_2$ group at their terminal group to only those surfaces of the SA molecules in that area of the processed body with SA molecules adsorbed thereon, obtained in the fourth and fifth steps. This chemical adsorption step can be formed by a method similar to that in the second step. The above steps are repeated to form an organic film having SA molecules laminated in only that area with SA molecules adsorbed thereon, formed by the fourth and fifth steps.

In addition to the present embodiment, other specific preferred embodiments are provided below.

Embodiment 1

FIG. 1 illustrates one embodiment that creates an organic multilayer film according to this invention. In this figure, a first vessel 1 contains an ethanol solvent and a 1-mM 1,18-octadecylbisphosphonic acid [$H_2O_3P(CH_2)_{18}PO_3H_2$] (here after referred to as "ODBP) solution. To create an organic film, the surface of a GaAs substrate 2 is cleaned using a mixed solution of $H_2O_2$ and $H_2SO_4$, and the substrate is subsequently washed in pure water, dried, and then immersed in the solution contained in the first vessel. During the chemical adsorption of ODBP, the solution may be maintained at room temperature or may be heated. The solvent may be an organic solvent other than the ethanol solution, or may be pure water, but the organic solvent is preferable. The GaAs substrate 2 remains immersed in the solution contained in the first vessel 1 for several (as an example, four) hours, and is them removed therefrom and washed in pure ethanol contained in a second vessel 3 to remove the excess ODBP molecules deposited on the surface (step 1).

Then, the substrate is immersed for about five minutes in an ethanol-diluted 1-mM oxy zirconium chloride [$ZrOCl_2 \cdot 8H_2O$] solution contained in a third vessel 4. The oxy zirconium chloride may be used in powder or liquid form. During the chemical adsorption of Zr ions, the solution may be maintained at room temperature or may be heated. The solvent may be organic, other than the ethanol solution, or may be pure water, but an organic solvent is preferable. The GaAs substrate 2 is then removed from the solution contained in the third vessel 4 and transferred to the pure ethanol contained in a second vessel 5, where it is supersonically washed to remove the excess Zr ions, including Zr clusters deposited on the surface (step 2). Then, the GaAs substrate 2 is returned to an ethanol solvent and a 1-mM ODBP solution in a fourth vessel 6 and immersed therein for about two hours to further adsorb one layer of ODBP molecules onto GaAs substrate 2, the surface of which is covered with Zr ions. The GaAs substrate 2 can be cycled through the above steps in the given sequence of second, third, second, and fourth vessels, to accumulate one layer of ODBP on the substrate per repetition.

Figure 2:
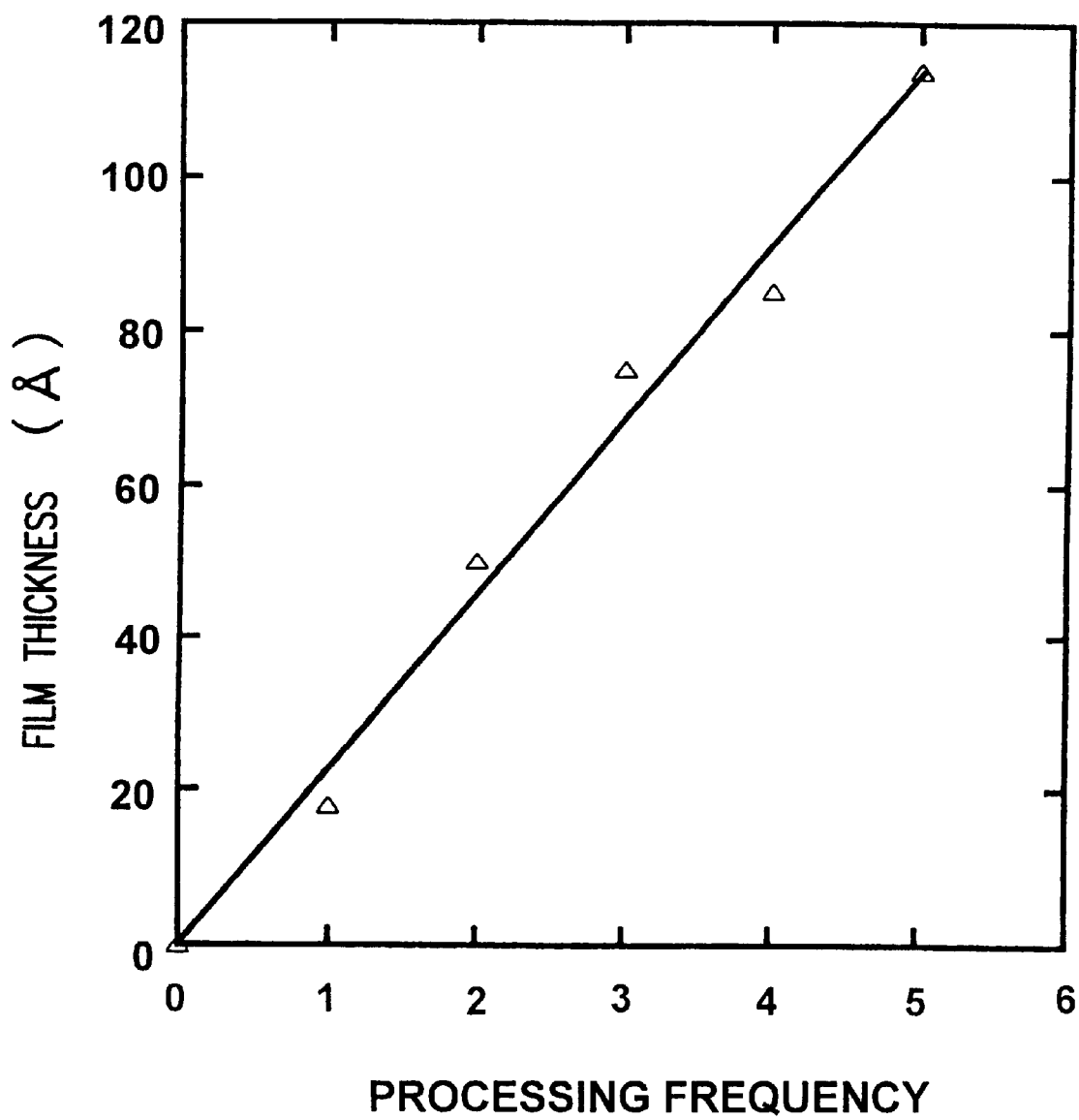
FIG. 2 is a graph showing the change of the film thickness of organic laminated films as a function of the number of treatment as measured by ellipsometry.

FIG. 2 is a graph showing the variation of film thickness of the first to a fifth layers sequentially laminated during the above steps, as measured by ellipsometry. This graph shows that as the number of repetitions increases, the thickness increments by the same amount, with one layer of ODBP molecules laminated each time. The five-layer built-in film obtained was examined by an atomic-force microscope and found to be dense and flat at the atomic level, without pin holes. Although this embodiment has been described in conjunction with use of the GaAs substrate, a dense and very uniform multilayer film free of pin holes can also be laminated onto a cleavage plane of other III–V-group compound semiconductor substrates, that is, GaP, GaSb, InP, InAs, or InSb substrates, using a similar process.

Embodiment 2

Figure 3:
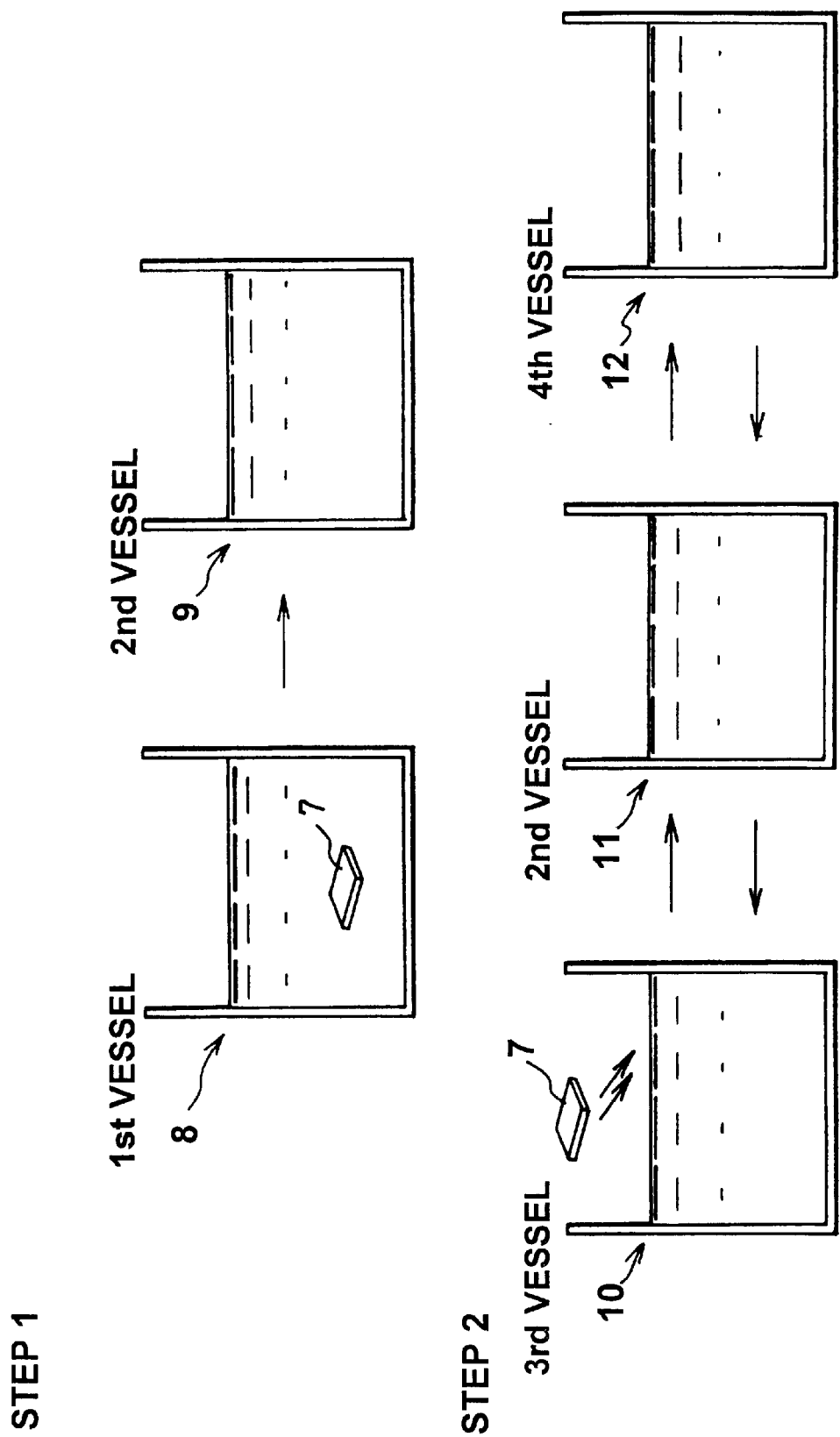
FIG. 3 is a schematic explanatory drawing of a process for manufacturing organic laminated films, which is described as Embodiment 2 of this invention.

FIG. 3 illustrates another embodiment that creates an organic multilayer film according to this invention. In this figure, a first vessel 8 contains an ethanol solvent and a 1-mM ODBP solution. To create an organic film, the surface of a GaSb substrate 7 is cleaned with a mixed solution of $H_2O_2$ and $H_2SO_4$, and the substrate is then washed in pure water, dried, and immersed in the solution contained in first vessel 8. The ODBP may be used in powder or liquid form. During the chemical adsorption of ODBP, the solution may be maintained at room temperature or may be heated. The solvent may be an organic solvent other than the ethanol solution, or may be pure water, but an organic solvent is preferable. The GaSb substrate 7 remains immersed in the solution contained in the first vessel 8 for several (five, as an example) hours, and is then removed therefrom and washed in pure ethanol contained in a second vessel 9 to remove the excess molecules deposited on the surface (step 1).

Then, substrate 7 is immersed in an ethanol-diluted 1-mM zirconiumacetate $[(CH_3COO)_4Zr]$ solution in a third vessel 10 for about ten minutes. The zirconiumacetate may be used in powder or liquid form. During the chemical adsorption of zirconiumacetate, the solution may be maintained at room temperature or may be heated. The solvent may be an organic solvent other than the ethanol solution, or may be pure water, but an organic solvent is preferable. The GaSb substrate 7 is then removed from the solution contained in the third vessel 10 and transferred to the pure ethanol in a second vessel 11, where it is supersonically washed to remove the excess Zr ions deposited on the surface.

Then, the GaSb substrate 7 is placed into an ethanol solvent and a 1-mM MHDA in a fourth vessel 12 and left immersed therein for about four hours to further adsorb one layer of MHDA molecules onto the SA film on the GaSb substrate 7, the surface of which is covered with Zr ions (step 2). Subsequently, after washing in second vessel 11, step 2 (the immersion in the third vessel 10 and subsequent operations) can be repeated to accumulate one additional layer of MHDA molecules on the substrate per repetition. This process was repeated five times, and ellipsometry measurements put film thickness at approximately 14 nm, indicating the formation of one layer of ODBP and four layers of MHDA. Although this embodiment has been described in conjunction with the use of a GaSb substrate, a multilayer film can be laminated on a cleavage plane of other III–V-group compound semiconductor substrates, including GaP, GaAs, InP, InAs, or InSb substrates, using a similar process.

Embodiment 3

Figure 4:
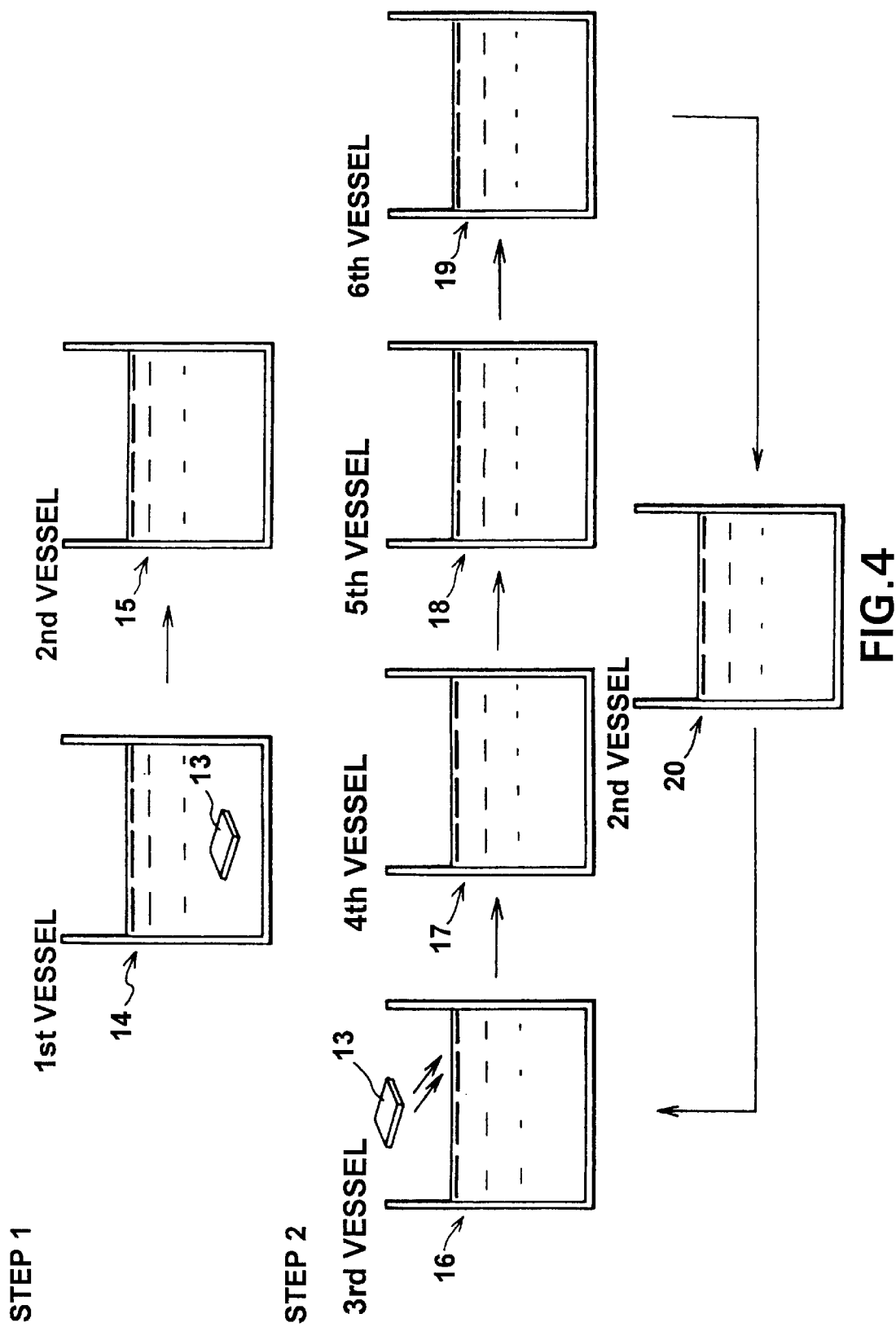
FIG. 4 is a schematic explanatory drawing of a process for manufacturing organic laminated films, which is described as Embodiment 3 of this invention.

FIG. 4 illustrates yet another embodiment that creates an organic multilayer film according to this invention. In this figure, a first vessel 14 contains a 19-acetoxynonadecylphosphonic acid $[H_3CO_2C(CH_2)_{17}PO_3H_2]$ solution. To create an organic film, an InSb substrate 13 is cleaved in this solution, contained in first vessel 14. The surface of the substrate 13 can be processed as in Embodiment 1. 19-acetoxynonadecylphosphonic acid may be used in powder or liquid form. During the chemical adsorption of 19-acetoxynonadecylphosphonic acid, the solution may be maintained at room temperature or may be heated. The solvent may be an organic solvent other than the ethanol solution, or may be pure water, but an organic solvent is preferable. The InSb substrate 13 remains immersed in the solution contained in the first vessel 14 for several hours, and is then removed therefrom and washed in pure ethanol in a second vessel 15 to remove the excess 19-acetoxynonadecylphosphonic acid molecules deposited on the surface (step 1).

Then, substrate 13 is immersed for ten minutes in a solution of 1-M $LiAlH_4$ dissolved into tetrahydrofuran in a third vessel 16, and is then immersed in a 20% dilute hydrochloric solution in a fourth vessel 17 to denature the $COOCH_3$ groups exposed on the surface into OH groups. During the denaturing of $COOCH_3$ groups into OH groups, the solution may be maintained at room temperature or may be heated. The solvent may be an organic solvent other than the tetrahydrofuran solution or may be pure water. The InSb substrate 13 is then removed from the solution and washed in pure water in a fifth vessel 18. Next, the InSb substrate 13 is placed in a sixth vessel 19 containing a solution of 1-mM 24-acetoxytetracosanyltrichlorosilane $[CH_3COO(CH_2)_{22}SiCl_3]$ dissolved in a solvent of hexadecane: carbon tetrachloride in the ratio 4:1, and is immersed therein for about four hours to further adsorb one layer of 24-acetoxytetracosanyltrichlorosilane on the InSb substrate 13 on which an SA film with OH groups covering its surface is formed (step 2).

Subsequently, after washing in a second vessel 20, step 2 can be repeated to accumulate one layer of 24-acetoxytetracosanyltrichlorosilane on the substrate per repetition. After ten repetitions, ellipsometry measurements put the film thickness at approximately 32 nm, indicating the formation of one layer of 19-acetoxynonadecylphosphonic acid and nine layers of 24-acetoxytetracosanyltrichlorosilane. Although this embodiment has been described in conjunction with the use of the InSb substrate, a multilayer film can be laminated on a cleavage plane of other III–V-group compound semiconductor substrates, including GaP, GaAs, GaSb, InP, or InAs substrates, using a similar process.

Embodiment 4

Figure 5:
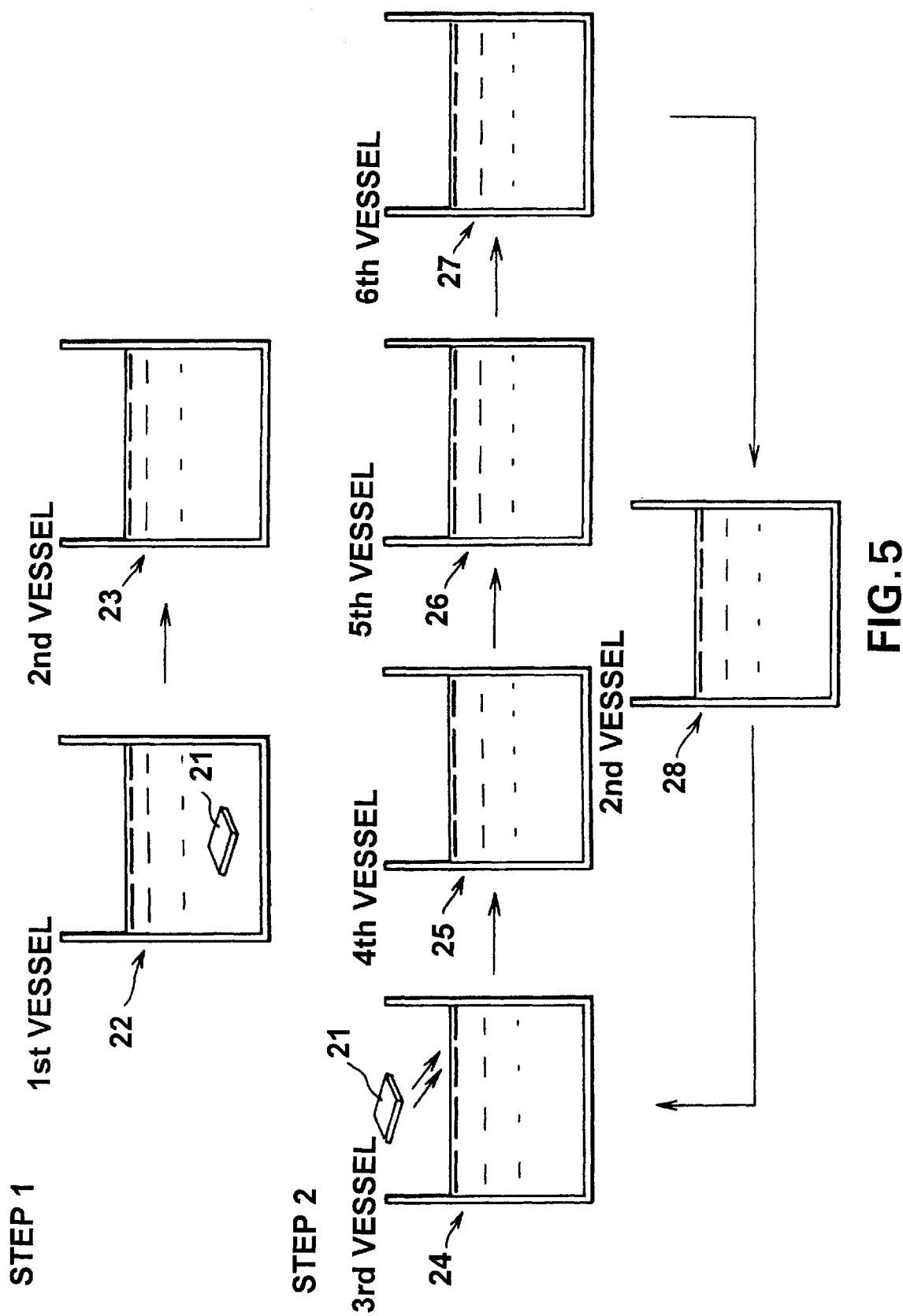
FIG. 5 is a schematic explanatory drawing of a process for manufacturing organic laminated films, which is described as Embodiment 4 of this invention.

FIG. 5 illustrates still another embodiment that creates an organic multilayer film according to this invention. In this figure, a first vessel 22 contains a solution of ethanol solvent and a 1-mM 16-vinylhexadecylphosphonic acid $[CH_2=CH(CH_2)_{14}PO_3H_2]$. To create an organic film, an InAs substrate 21 is immersed in the solution contained in the first vessel 22. The surface of the substrate 21 may be produced as described in Embodiment 1. During the chemical adsorption of 16-vinylhexadecylphosphonic acid, the solution may be maintained at room temperature or may be heated. The solvent may be an organic solvent other than the ethanol solution, or may be pure water, but an organic solvent is preferable. The InAs substrate 21 remains immersed in the solution contained in the first vessel 22 for several hours, and is then removed therefrom and washed in pure ethanol in a second vessel 23 to remove the excess 16-vinylhexadecylphosphonic acid molecules deposited on the surface (step 1).

Then, the substrate 21 is immersed for one minute in a solution of 1-M $B_2H_6$ dissolved into tetrahydrofuran in a third vessel 24, and is then immersed in a fourth vessel 25 in a 0.1-M sodium hydroxide solution containing 30% of hydrogen peroxide to denature $CH_2=CH$ groups exposed on the surface into OH groups. During the denaturing of $CH_2=CH$ groups into OH groups, the solution may be maintained at room temperature or may be heated. The solvent may be an organic solvent other than the tetrahydrofuran solution or may be pure water, but an organic solvent is preferable. After immersion in the solution, the InAs substrate 21 is removed and washed in pure water in a fifth vessel 26. Then, the InAs substrate 21 is placed in a sixth vessel 27 containing a solution of 1-mM 16-vinylhexadecyltrichlorosilane [$CH_2=CH(CH_2)_{14}SiCl_3$] dissolved into a solvent of hexadecane: carbon tetrachloride in the ratio 4:1 and is immersed therein for about five hours to further adsorb one layer of 16-vinylhexadecyltrichlorosilane on the InAs substrate 21 on which an SA film with OH groups covering its surface is formed (step 2).

Subsequently, after washing in a second vessel 28, step 2 can be repeated to accumulate one layer of 16-vinylhexadecyltrichlorosilane on the substrate per repetition. After 20 repetitions, ellipsometry measurements put film thickness at approximately 39 nm, indicating the formation of one layer of 16-vinylhexadecylphosphonic acid and 19 layers of 16-vinylhexadecyltrichlorosilane. According to this embodiment, a multilayer film can also be laminated on a cleavage plane of InAs, GaAs, GaSb, InP, or InSb substrates, using a similar process.

Embodiment 5

Specific preferred embodiments of a method for producing a fine pattern using the organic films according to this invention are shown below.

A laminate of different compounds, different III–V-group compounds for example, is formed as a processed body. This laminate is formed by alternately laminating a first layer consisting of (as an example) GaAs and a second layer consisting of $Al_xGa_{(1-x)}As$ and is produced using the molecular-beam epitaxial technique (MBE) to form an epitaxial layer on a GaAs substrate having a (100) crystal face as its surface. The laminate may be formed by laminating a first layer consisting of InAs and a second layer consisting of $Al_xIn_{(1-x)}As$ or $Al_xGa_{(1-x)}Sb$, but is not limited to these examples.

The laminate (processed body) is cleaved in an organic solvent containing SA molecules, in situ. The cleaving is executed to expose the lamination face of the laminate in such a way as to preclude the formation of oxide before chemical adsorption of SA molecules. SA molecules are adsorbed to particular crystal structures via the head group. If for example, GaAs is used as a laminate, 1-octadecanethiol (hereafter referred to as "ODT") or a similar derivative is used as SA molecules.

Figure 6:
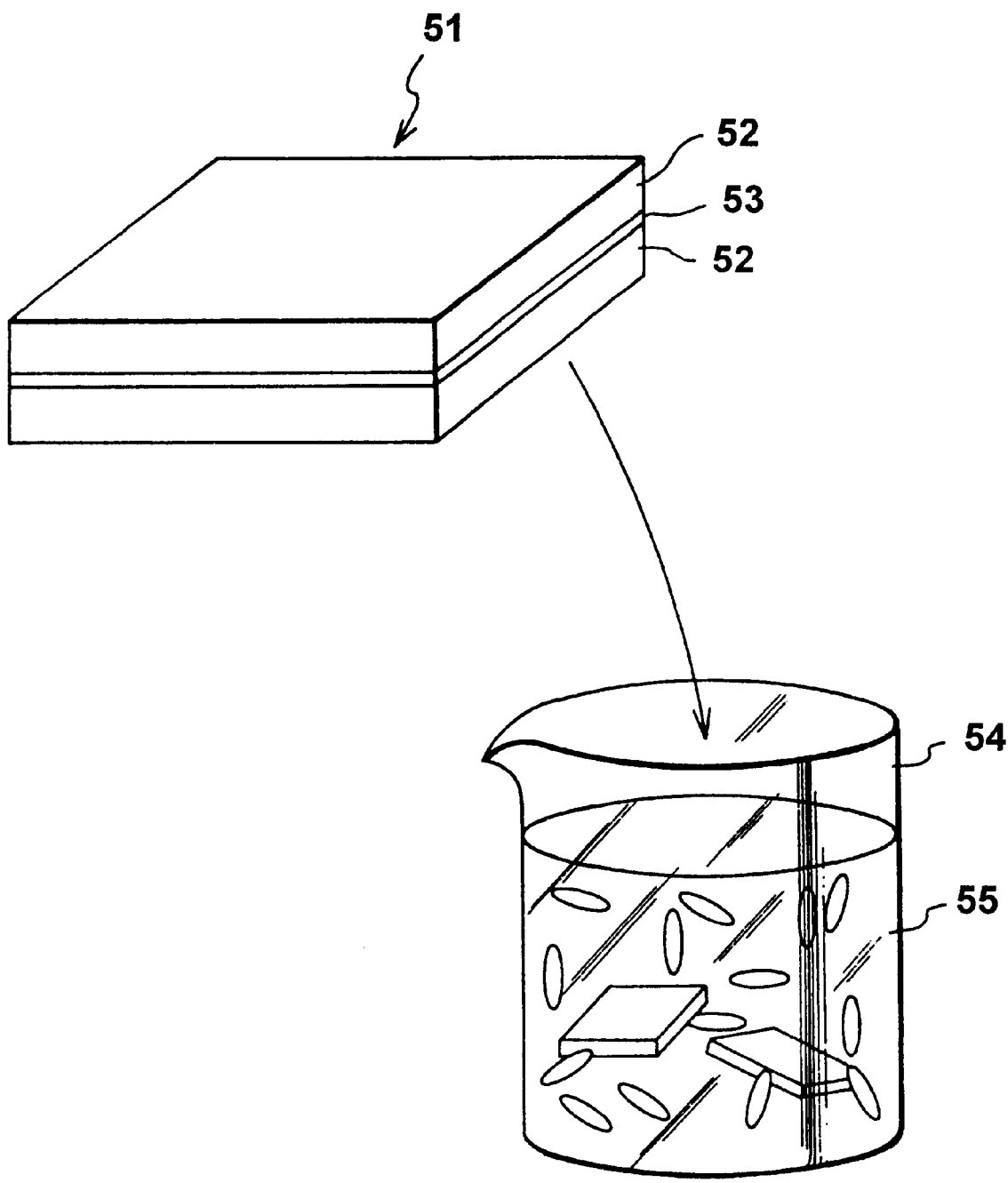
FIG. 6 is an explanatory drawing showing that a laminate of epitaxial layers is cleaved in a solution according to Embodiment 5 of this invention.

FIG. 6 shows that a laminate 51 (quantum-well hetero structure) formed by alternatively laminating a first layer 52 of GaAs and a second layer 53 of $Al_xGa_{(1-x)}As$ (x=0.1 to 1.0) on a GaAs substrate having a (100) crystal face as its surface as described above is cleaved in a solution 55 in a container 54. The solution 55 is obtained by dissolving ODT representing SA molecules into an ethanol solution so that the concentration of ODT becomes 1 mM (mM/1). According to this embodiment, the laminate 51 is cleaved in the solution 55 to expose a (110) face, then remains immersed therein for several hours to chemically adsorb ODT molecules onto the cleavage plane. The laminate 51 is cleaved, for example, by marking the surface of the laminate 51 at two positions and using a cutter to cut the laminate along the line between the marked points. The ODT may be used in powder or liquid form. During the adsorption of ODT, the solution may be maintained at room temperature or may be heated. The solvent may be an organic solvent other than the ethanol solution, or may be pure water. Ideally, the solution is deaerated to avoid the formation of oxide on the cleavage plane which will prevent the formation of an SA layer.

The laminate 51 is immersed in the above solution for (for example) several hours, taken out therefrom, and washed in pure ethanol to remove the excess ODT molecules deposited on the surface. In this example, in the cleavage plane shown in FIG. 7($a$), ODT molecules were adsorbed only to the (110) face of the GaAs layer (first layer 52). Thus, the ODT molecules provide patterns (lines) of a line width corresponding to the thickness of the first layer 52, with the interval of the lines corresponding to the thickness of the $Al_xGa_{(1-x)}As$ layer (the second layer 53). The ODT molecules are not adsorbed to the second layer 53, because prior to the adsorption of ODT molecules on the surface of the second layer 53, a trace amount of oxygen present in the solution is adsorbed to the second layer, which is then oxidized. The ODT molecules, however, are selectively adsorbed to the first layer 52. In this case, the SH groups— the head groups of the ODT molecules—are bound directly to Ga or As atoms in the substrate, without the intervention of oxygen or carbon present in the solution as impurities.

In addition, similar experiments were conducted using a InAs, InP, GaSb, InSb, or GaP layer as the first layer 52 and an $Al_xIn_{(1-x)}As$, $Al_xIn_{(1-x)}P$, $Al_xGa_{(1-x)}Sb$, or $Al_xIn_{(1-x)}Sb$ layer as the second layer 53. ODT molecules were adsorbed to the InAs, InP, GaSb, InSb, or GaP layer but not to the $Al_xIn_{(1-x)}As$, $Al_xIn_{(1-x)}P$, $al_xGa_{(1-x)}Sb$, or $Al_xIn_{(1-x)}Sb$ layer.

Next, laminate 51 is dried adequately, and different types of SA molecules are adsorbed to an oxidized surface of the laminated layer not covered by SA molecules. If oxidized $Al_xGa_{(1-x)}As$ (for example) is used as a laminate, SA molecules comprise 1,16-hexadecylbisphosphonic acid HDBP having $PO_3H_2$ groups, 16-octadecyltrichlorosilane (hereafter referred to as "OTS") having trichlorosilyl groups (—$SiCl_3$), molecules having alkoxyl groups (—$Si(O(CH_2)nCH_3)_3$), or similar derivatives. As the solution used to form SA molecules, an organic solvent such as pure water or ethanol is commonly used for HDBP, and a mixed organic solvent of hexadecane and carbon tetrachloride in the ratio 7:3 is commonly used for OTS. Either powder or liquid crystals may be used. During the adsorption of HDBP or OTS, the solution may be maintained at room temperature, or may be heated or cooled.

Figure 7A:
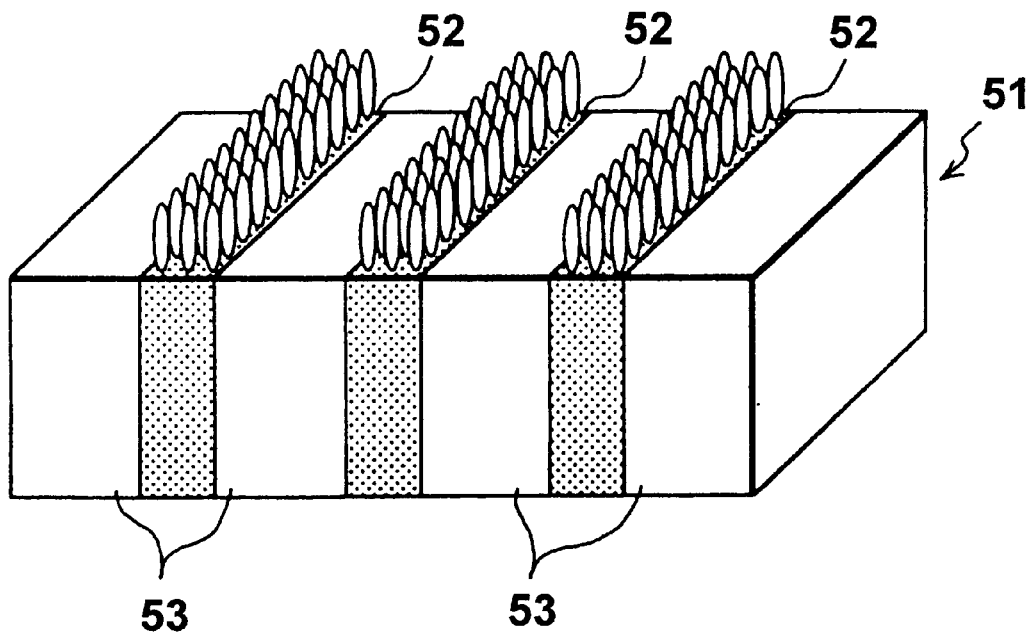
FIGS. 7(a) and 7(b) are image drawings showing that octadecanethiol molecules and 12-dodecylbisphosphonic acid are selectively adsorbed onto the cleavage plane of epitaxial layers to form a pattern.
Figure 7B:
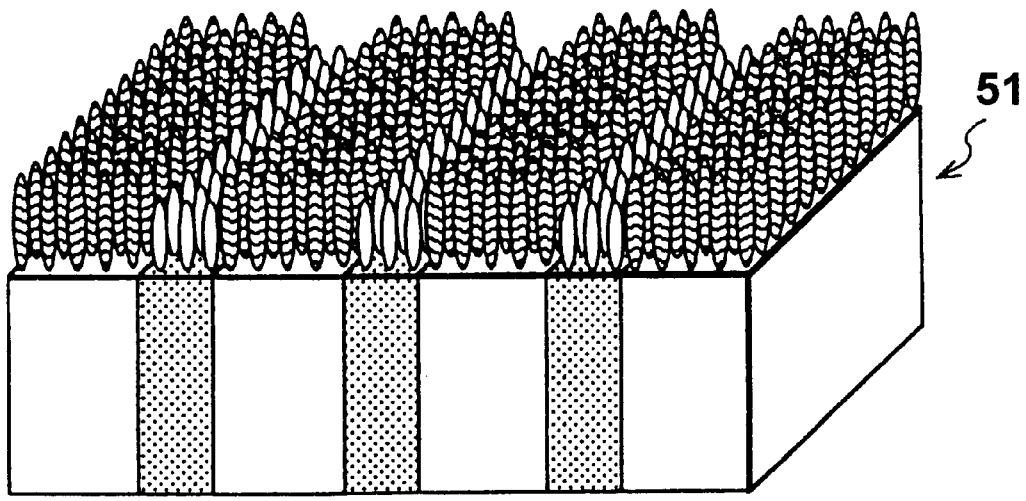

The laminate 51 is immersed in the above solution for several hours and is then removed and washed in pure ethanol to remove the excess HDBP or OTS molecules deposited on the surface. In this figure, in the cleavage plane, ODT molecules are adsorbed only to the (110) face of the GaAs layer (the first layer 52), while HDBP molecules are adsorbed only to the $Al_xGa_{(1-x)}As$ layer (the second layer 53), as shown in FIG. 7($b$). The ODT molecules provide patterns (lines) of a line width corresponding to the thickness of the first layer 52, while HDBP molecules provide patterns (lines) of a line width corresponding to the thickness of the second layer 53, with the interval of the patterns corresponding to the thickness of the GaAs and $Al_xGa_{(1-x)}As$ layer, though this is not clear due to the small difference between ODT and HDBP. HDBP is not adsorbed to the first layer 52 because ODT molecules are already adsorbed to the surface of the first layer 52 to form on the surface $CH_3$ groups, to which $PO_3H_2$ or $SiCl_3$ groups are not chemically adsorbed.

According to this embodiment, the width of the line formed of ODT and HDBP molecules corresponds to the thickness of the epitaxial layer, which can be controlled down to a one-atom layer, so lines of an arbitrary line width 0.0005 to 1 mm can be produced accurately, as can lines of the width a one-molecule layer can be produced. Production is easy, due to the use of the self-selective adsorption of desired molecules to a substrate material. Although this method basically provides lines of a width on the order of a one-atom layer, the epitaxial layer is preferably formed as an array structure of three or more molecules in order to improve the linearity of lines.

Figure 8A:
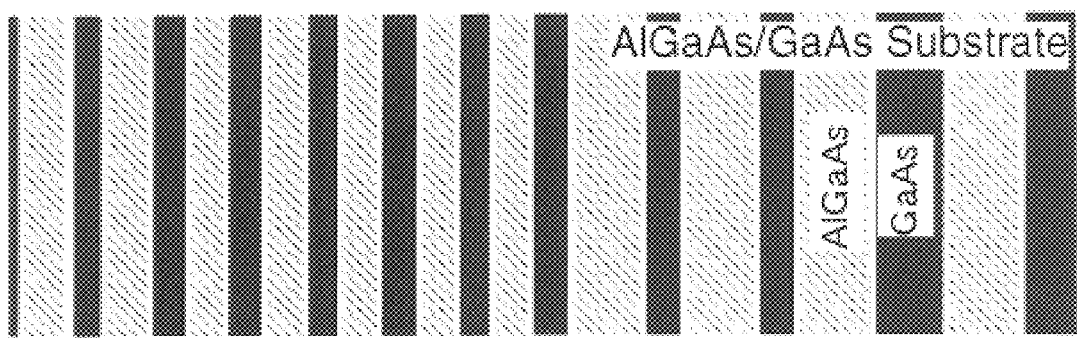
FIG. 8(a) is a cross-sectional view of the structure of the substrate used in Embodiment 5.
Figure 8B:
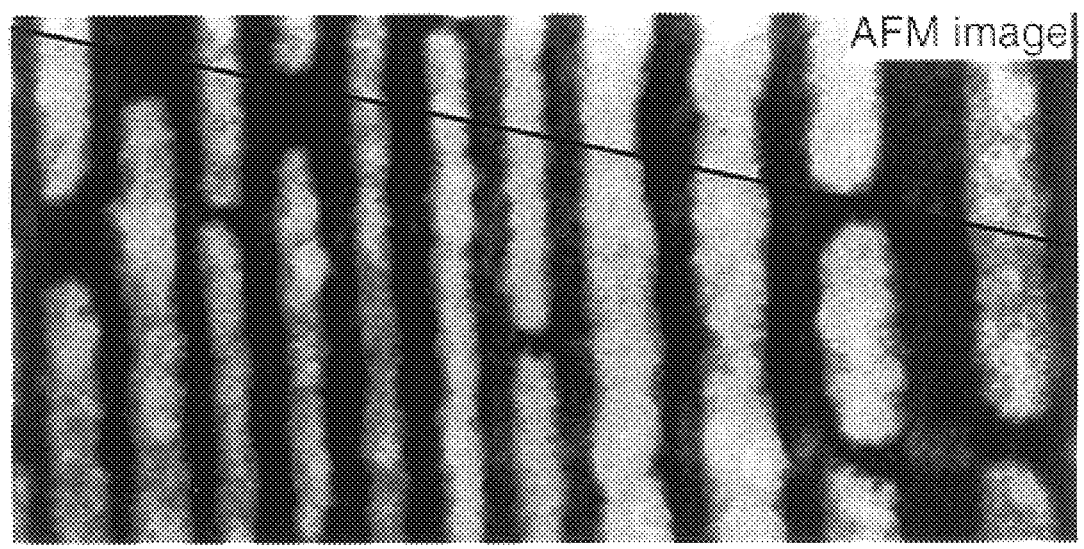
FIG. 8(b) shows an image of the laminate obtained using an atomic-force microscope.
Figure 8C:
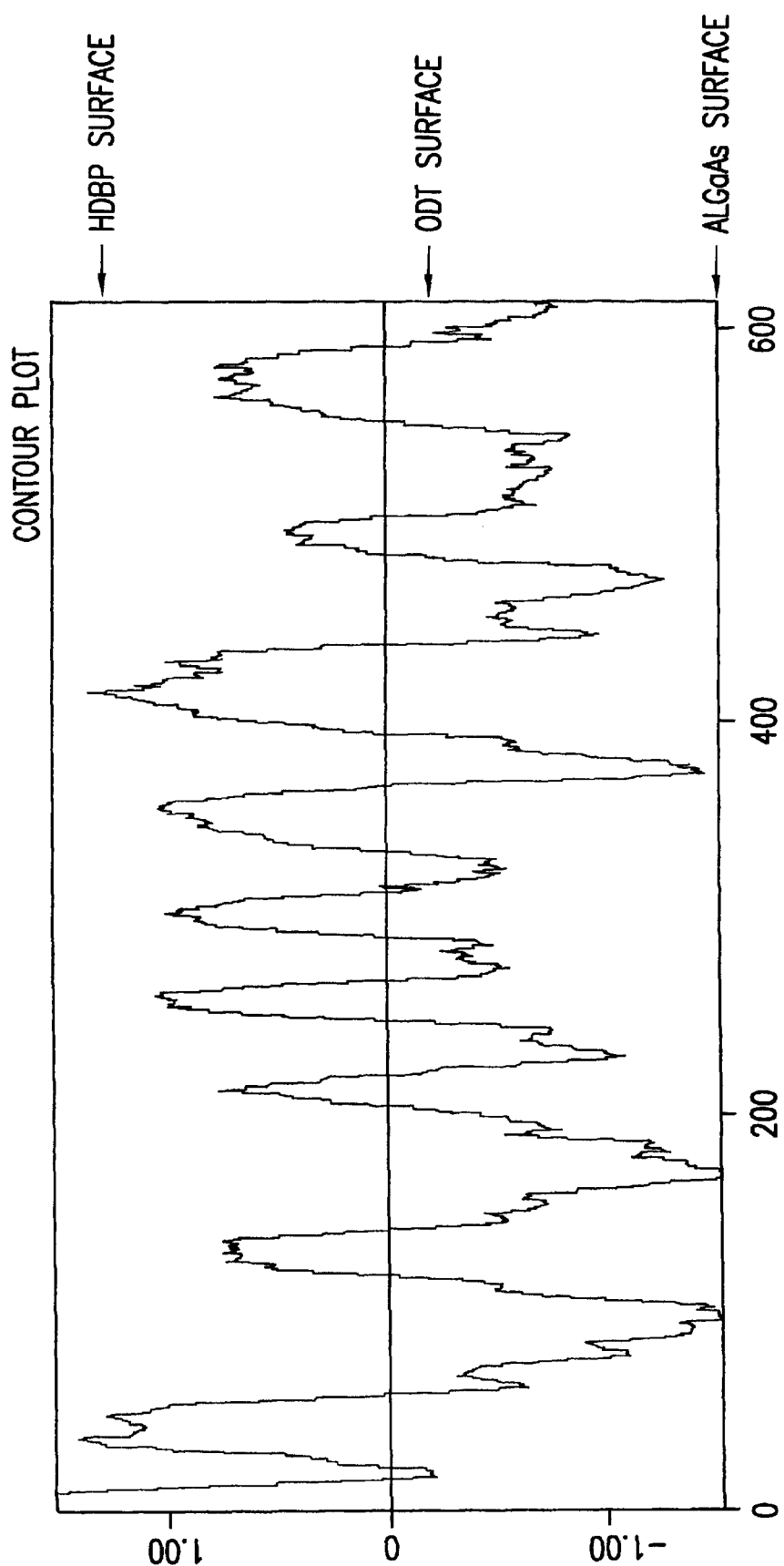
FIG. 8(c) is a contour plot along the lines as shown in FIG. 8(b).

The inventor cleaved a laminate of $GaAs/Al_{0.55}Ga_{0.65}As$ in a 1-mM ODT ethanol solution, allowed the laminate to stand for about 24 hours, and washed it in pure ethanol. After sufficient drying, the laminate was further immersed in a 1-mM HDBP ethanol solution for 15 minutes and the surface washed in ethanol was observed using an atomic-force microscope to find that the AlGa As area was about 1.5 nm higher than the GaAs area while finding lines corresponding to the thickness of these layers. FIG. 8(a) is a schematic cross-sectional view of the structure of the laminate of $GaAs/Al_{0.35}Ga_{0.65}As$ used. FIG. 8(b) shows an image obtained using an atomic-force microscope. FIG. 8(c) shows a contour plot along the lines shown in FIG. 8(b). These figures indicate that GaAs area on the surface cleaved in the 1-mM ODT ethanol solution and allowed to stand for 24 hours was 1 nm higher than the AlGaAs area (in this case, the ODT molecules were inclined from the substrate by about 30°), but that the substrate was immersed for 15 minutes in a 1-mM HDBP ethanol solution to selectively adsorb HDBP molecules on the $Al_{0.35}Ga_{0.65}As$ area, thereby forming an ODT-HDBP-mixed SAM nanostructure.

The HDBP and ODT molecules had the same molecular length of about 2.5 nm. This is due to a difference in packing density caused by a difference in interaction between each type of molecules and the substrate, and the self-assembled film of HDBP had a larger height (film thickness: about 2.4 nm) and a higher packing density.

Embodiment 6

After multiple solutions of different SA molecules have been prepared, the second step cleaves the above laminate in a solution containing SA molecules to adsorb the SA molecules, the third step washes the laminate, and prior to the fourth step, the sixth step chemically processes the laminate, which is then immersed in a different solution to adsorb a different type of SA molecule. This process can be sequentially executed to selectively laminate a different type of SA film to only a face on which SA monomolecules have been formed. For example, the same process as in Embodiment 5 is used, but the type of SA molecule is changed to MHDA. After lines of SAM molecules have been formed on only the GaAs layers, the laminate is immersed for about ten minutes in a solution of 1-mM copper acetate $(CH_3COO)_2$Cu dissolved into ethanol (step 1). Consequently, COOH groups with SA molecules exposed on their surfaces are denatured into $(COO)2Cu$. During chemical processing with Cu ions, the solution may be maintained at room temperature or may be heated. The solvent may be an organic solvent other than the ethanol solution, or may be pure water.

Figure 9A:
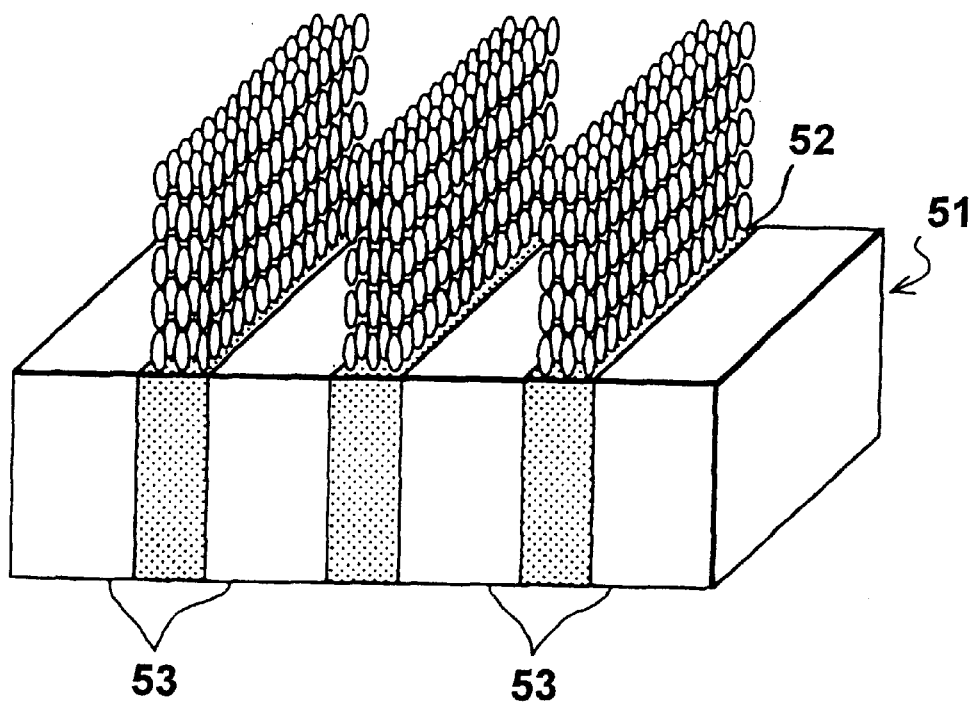
FIGS. 9(a) and 9(b) are image drawings showing organic film surfaces selectively laminated on a pattern produced according to Embodiment 6.
Figure 9B:
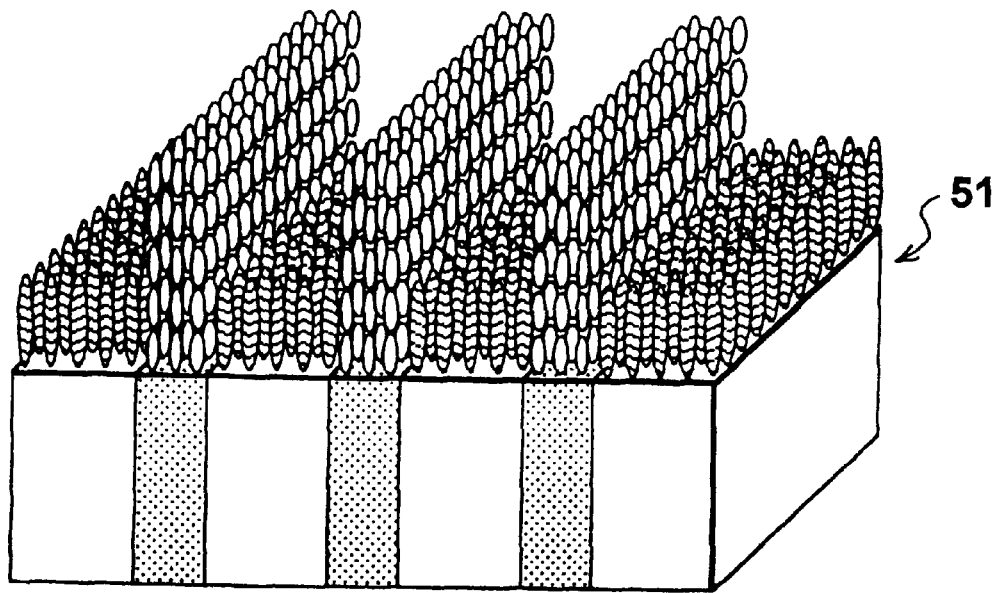

The laminate 51 is removed from the solution, washed in a pure ethanol solution, and placed in a solution of 1-mM MHDA dissolved into an ethanol solvent. It is immersed therein for about four hours to further adsorb one MHDA layer to only the area covered with SA molecules (step 2). Subsequently, after washing in pure water or an organic solvent, the above steps can be repeated to accumulate another MHDA layer to only that area on which SA molecules have been formed (FIG. 9(a)). As shown in FIG. 9(b), the laminate can then be immersed in a solution containing a different type of SA molecules to chemically adsorb the SA modules to the $Al_xGa_{(1-x)}As$ (x=0.1 to 1.0) layer on which no SA molecules have been adsorbed. If, for example, 16-hexadecylphosphonic acid [$CH3(CH2)15PO3H2$] (hereafter reffered to as "HDPA") molecules are used, HDPA is adsorbed to the $Al_xGa_{(1-x)}As$ layer because $PO_3H_2$ acts as the head group, binding to OH groups spontaneously formed on the surface. MHDA is directly chemically adsorbed to GaAs because SH acts as the head group. In this example, MHDA molecules have already been adsorbed to the GaAs layer (the first layer 52), so HDPA is adsorbed only to the $Al_xGa_{(1-x)}As$ (x=0.1 to 1.0) layer (the second layer 53).

The inventor used the above process to form five laminated films of SA molecules of MHDA at only the GaAs area of laminate 51, while forming SA molecules of HDPA on the $Al_xGa_{(1-x)}As$ layer. The obtained surface was examined with atomic-force and frictional-force microscopes to confirm five lines of about 5 nm height corresponding to the thickness of the GaAs layer. The surfaces of these lines provided a frictional force different from that provided by the other faces of the substrate, and an organic-film composite pattern having a nanometer line width was observed in which five layers of MHDA molecules and one layer of HDPA molecules were alternately arranged line by line.

Embodiment 7

Figure 10A:
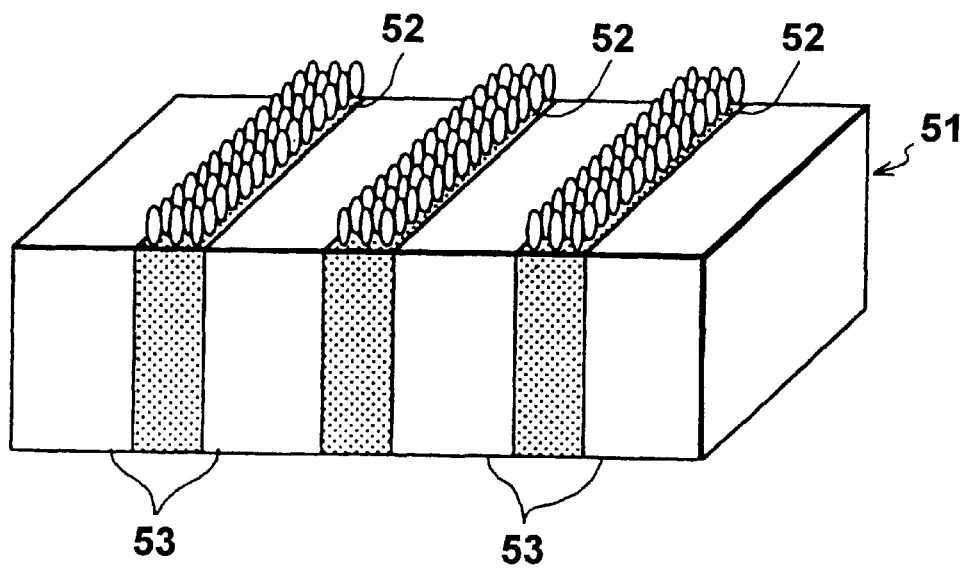
FIGS. 10(a) and 10(b) are image drawings showing organic film surfaces selectively laminated on a pattern produced according to Embodiment 7.
Figure 10B:
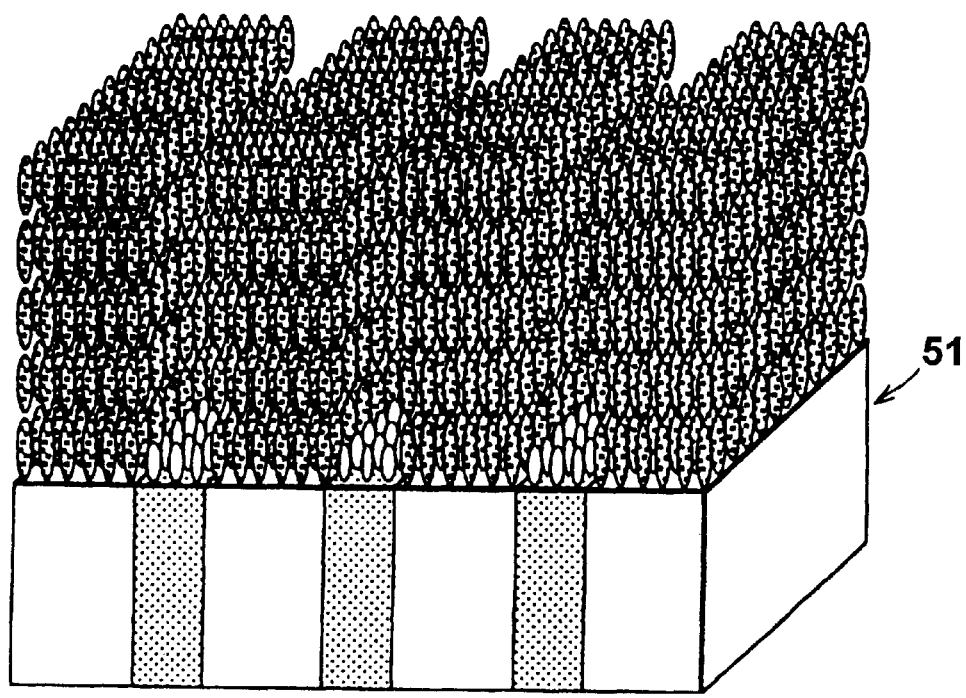

After multiple solutions of different SA molecules have been prepared and the process shown in Embodiment 5 used to form a monomolecular composite pattern (FIG. 10(a)), the ninth step chemically processes the substrate, and the tenth step immerses it in a different solution to adsorb a different type of SA molecule. This process can be sequentially executed to selectively laminate a different type of SA film only to a face on which SA monomolecules have been formed during the fourth and fifth steps (FIG. 10(b)). For example, the same process as in Embodiment 5 is used, but the type of SA molecule is changed to 8-octanylbisphosphonic acid [$H_2O_3P(CH_2)_8PO_3H_2$] (hereafter referred to as "OBP") to form lines of SA molecules on the $Al_xGa_{(1-x)}As$ layer. The substrate is then immersed for about 10 minutes in a solution of 1-mM oxy zirconium chloride $ZrOCl_2·8H_2O$ dissolved into ethanol (step 1). Consequently, $PO_3H_2$ groups with SA molecules exposed on their surfaces are modified with Zr ions. During chemical processing with Zr ions, the solution may be maintained at room temperature or may be heated. The solvent may be an organic solvent other than the ethanol solution, or may be pure water. Subsequently, the laminate 51 is removed from the solution and washed in a pure ethanol solution.

Laminate 51 is again placed in a solution of 1-mM OBP dissolved into an ethanol solvent and immersed therein for about one hour to further adsorb one OBP layer to only the area whose surface is modified by Zr ions (step 2). After washing in pure water or an organic solvent, the above steps can be repeated to accumulate one OBP layer per repetition to only that area on which SA molecules have been formed. For example, if OBP molecules are used, OBP is chemically adsorbed to SA molecules of OBP modified with Zr ions because $PO_3H_2$ acts as the head group to coordinate-bind surface-modified Zr ions to the under-layer of $PO_3H_2$. The ODT formed directly on the GaAs surface is directly chemically adsorbed to GaAs because SH acts as the head group. In this example, ODT molecules have already been adsorbed to the GaAs layer (the first layer 52) to expose $CH_3$ groups on the surface, so OBP is adsorbed only to the $Al_xGa_{(1-x)}As$ (x=0.1 to 1.0) layer (the second layer 53).

The inventor used the above process to form five laminated films of SA molecules of OBP to only that area of the $Al_xGa_{(1-x)}As$ (x=0.1 to 1.0) layer of laminate 51. The surface obtained was examined with atomic-force and frictional-force microscopes to confirm five lines of about 5 nm in height, corresponding to the thickness of the $Al_xGa_{(1-x)}As$ (x=0.1 to 1.0) layer. The surfaces of these lines provided a frictional force different from that provided by the other faces of the substrate, and an organic-film composite pattern having a nanometer line width was observed in which one layer of ODT molecules and five layers of OBP molecules were alternately arranged line by line.

A combination of processes according to Embodiments 6 and 7 of this invention enables the formation of a fine composite organic laminated film having two different film structures and a pattern of nanometer scale. By producing a band of different types of SA monomolecules or of laminated films of SA molecules, a basic device structure such as a transistor structure can be formed with SA molecules. Thus, when all layers of a certain pattern portion comprise insulating SA molecules except a final layer comprising laminated conductive SA molecules, and if the pattern portion is used as an electrode while the other pattern portion is used as a channel to control channel width, or the thickness of the epitaxial layer, basic factors such as the amount of charge stored in the channel and the I–V characteristic can be controlled. Furthermore, in a group of different parallel lines (the arrangement of lines shown in FIG. 10(b)), electron transport characteristics between the line at one end of the group and the line at the other end (the electron transport characteristics in the line width direction of the group of lines) may be examined comprehensively. Such measurements can be executed by forming metal contact pads at the respective ends of the group.

Embodiment 8

A pattern on the order of nanometers can also be produced on a (100) crystal face of a III–V-group compound. According to this process, for example GaAs is homoepitaxially grown on a (100) crystal face of a GaAs substrate 56 inclined by about 2°, and the surface is then flattened. This process provides GaAs (001) that is clean and flat at the atomic level, with step edges spaced at equal intervals, as shown in FIG. 11(a).

A process is then executed that epitaxially grows another III–V-group compound on the surface (see FIG. 11(b)). Another III–V-group compound comprises, for example, $Al_xGa_{(1-x)}As$, and the epitaxial re-growth preferentially starts from the end of the step as shown in FIG. 11(b). In this figure, 57 is a re-grown portion.

Figure 11C:
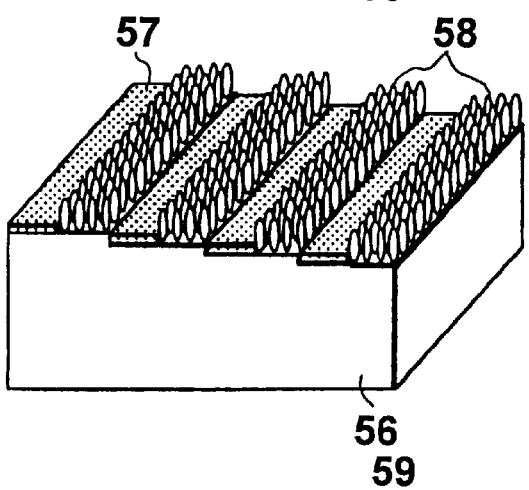
Figure 11D:
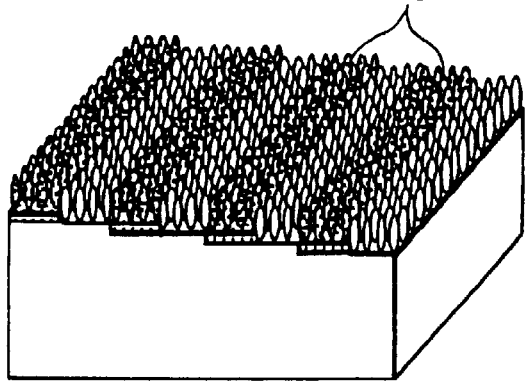

The substrate 56 is placed in an atmosphere in which ODT molecules flow to allow ODT molecules 58 to be deposited selectively on the epitaxially re-grown portion of GaAs, as shown in FIG. 11(c). Then, the substrate 56 is placed, for example, in an atmosphere in which OBP molecules flow to allow OBP molecules 59 to be deposited selectively on the epitaxially re-grown portion of GaAs, as shown in FIG. 11(d). Thus, the line width of the epitaxially re-grown portion can be regulated by controlling the processing time of the molecular-beam epitaxial technique. For example, lines on the order of nanometers can be produced in which SA molecules of ODT and OBP are mixed. Such a series of processes may comprise annealing the substrate 56 in a very-high-vacuum processing chamber to desorp oxide from the surface, epitaxially re-growing the compound, feeding the substrate via a load lock chamber to a processing chamber in (as one example) an N2 gas atmosphere, immersing the crystal 56 in an ODT ethanol solution vessel provided in the processing chamber, and chemically adsorbing OBP molecules to the crystal.

What is claimed is:

1. A process for creating an organic monomolecular film, comprising immersing an oxidized III–V-group compound semiconductor substrates in a solution or a molten liquid containing amphiphilic organic molecules having a $PO_3H_2$ group derivative at their terminal group and chemically adsorbing organic molecules on this substrate to form an organic molecular film.

2. A process for manufacturing an organic film according to claim 1, using organic molecules having a COOH group at the other end as amphiphilic organic molecules forming an organic monomolecular film in order to form a first organic monomolecular film, immersing the film in a solution containing transition metal ions, then immersing the substrate in a solution containing amphiphilic molecules with a SH group at one and a COOH group at the other end, to laminate another organic monomolecular film on this first organic monomolecular film.

3. A process for manufacturing an organic film according to claim 1, using organic molecules having a $PO_3H_2$ group at the other end as amphiphilic organic molecules forming an organic monomolecular film in order to form a first organic monomolecular film, immersing the film in a solution containing transition metal ions, and immersing the substrate in a solution containing amphiphilic molecules with a $PO_3H_2$ group at one and a $PO_3H_2$ group at the other end to laminate another organic monomolecular film on this first organic monomolecular film.

4. A process for manufacturing an organic film according to claim 1, using as solution contraining amphiphilic organic molecules having a $CH_2=CH$ group at the other end as amphiphilic organic molecules forming an organic monomolecular film, immersing a substrate in the solution to adsorb the organic molecules to the substrate in order to form a first organic monomolecular film, processing the substrate in a solution of $B_2H_6$ dissolved into an organic solvent and a mixed solution of sodium hydroxide and hydrogen peroxide, and immersing the substrate in a solution containing amphiphilic molecules with a $CH_2=CH$ group at one and an $SiCl_3$ group at the other end, to laminate another organic monomolecular film on this first organic monomolecular film.

5. A process for manufacturing an organic film according to claim 1, using a solution containing amphiphilic organic molecules having a $COOCH_3$ group at the other end as amphiphilic organic molecules forming an organic monomolecular film, immersing a substrate in the solution to adsorb the organic molecules to the substrate in order to form a first organic monomolecular film, processing the substrate in a solution of $LiAlH_4$ dissolved into an organic solvent and a dilute hydrochloric acid, and immersing the substrate in a solution containing amphiphilic molecules having a $COOCH_3$ group at one and an $SiCl_3$ group at the other end, to laminate another organic monomolecular film on this first organic monomolecular film.

6. A process for manufacturing an organic film according to any of claims 2 to 5, wherein the step for accumulating another organic monomolecular film on a first organic monomolecular film is repeated to accumulate additional organic films.

7. A process for producing a fine pattern of organic films obtained by a process according to claim 1, comprising:

a first step for forming in a non-oxidized atmosphere, adjacent faces having different chemical adsorption capabilities for self-assembled molecules or adjacent faces of different crystals, on a processed body in a non-oxidized atmosphere;

a second step for placing said adjacent faces in an atmosphere in which self-assembled molecules flow in a molecular state in order to adsorb the self-assembled molecules chemically to a processed body;

a third step for washing said processed body to remove the excess self-assembled molecules deposited on the processed body to obtain a pattern of self-assembled molecules;

a fourth step for chemically adsorbing the molecules on a portion of the processed body that has not been covered with self-assembled molecules during the third step after washing said processed body to remove the excess self-assembled molecules deposited on the processed body; and a fifth step for washing said processed body to remove the excess self-assembled molecules deposited on the processed body to obtain a pattern of self-assembled molecules.

8. A process for producing a fine pattern of organic films according to claim 7, comprising a sixth step operative prior to the fourth step for using chemical processing to denature the chemical adsorption capability of a region in which self-assembled molecules have been formed; a seventh step for chemically adsorbing a different type of self-assembled molecules having different chemical adsorption capability to the region in which self-assembled molecules have been formed, a eighth step for washing said processed body to remove the excess self-assembled molecules deposited on the processed body to obtain an organic film pattern.

9. A process for producing a fine pattern of organic films according to claim 8, wherein the sixth, seventh, and eighth steps are repeated to selectively laminate a fine self-assembled monomolecular layer.

10. A process for producing a fine pattern of organic films according to claim 7, comprising a ninth step performed after the fifth step to use chemical processing to denature chemical adsorption capability; a tenth step for chemically adsorbing different self-assembled molecules having a different chemical adsorption capability; and an eleventh step for washing said processed body to remove the excess self-assembled molecules deposited on the processed body to obtain an organic film pattern.

11. A process for producing a fine pattern of organic films according to claim 10, wherein the ninth, tenth, and eleventh steps are repeated to selectively laminate a fine self-assembled monomolecular layer.

12. A process for producing a fine pattern of organic films according to claim 7, wherein the different crystals are obtained by epitaxial growth.

13. A process for producing a fine pattern of organic films according to any of claim 7 to 11, wherein the processed body is a laminate of layers having different chemical adsorption capabilities for self-assembled molecules, and wherein the first step cleaves said laminate in a non-oxidized atmosphere.

14. A process for producing a fine pattern of organic films according to any of claim 7 to 11, wherein the first step includes a step for growing an epitaxial layer having components different from those of the crystal on a crystal surface that is slightly inclined from a certain crystal face.

15. A process for producing a fine pattern of organic films according to any of claim 7 to 11, wherein the self-assembled molecules used in the second, fourth, seventh, or tenth step are of multiple types so that the different types of self-assembled molecules are chemically adsorbed to adjacent faces having different chemical adsorption capabilities.

16. A process for producing a fine pattern of organic films according to any of claims 7 to 11, wherein the atmosphere in which self-assembled molecules flow in a molecular state is a solution into which a substance consisting of a group of self-assembled molecules is dissolved.

17. A process for producing a fine pattern of organic films according to any of claim 7 to 11, wherein the atmosphere in which self-assembled molecules flow in a molecular state is a gas consisting of a group of self-assembled molecules.

* * * * *

UNITED STATES PATENT AND TRADEMARK OFFICE
CERTIFICATE OF CORRECTION

PATENT NO. : 6,225,239 B1
DATED : May 1, 2001
INVENTOR(S) : Ohno et al.

It is certified that error appears in the above-identified patent and that said Letters Patent is hereby corrected as shown below:

Title page,
Item [73], the Assignee's information is incorrectly listed. Item [73] should read as follows: -- [73] Assignees: Sharp Kabushiki Kaisha, Osaka;
Agency of Industrial Science and Technology, Tokyo, both of (JP) --

Signed and Sealed this

Fifteenth Day of January, 2002

Attest:

*Attesting Officer*

JAMES E. ROGAN
*Director of the United States Patent and Trademark Office*